(12) United States Patent
Tabata et al.

(10) Patent No.: US 9,608,548 B2
(45) Date of Patent: *Mar. 28, 2017

(54) POWER GENERATING DEVICE AND ELECTRONIC COMPONENT

(71) Applicant: SEIKO EPSON CORPORATION, Tokyo (JP)

(72) Inventors: Kunio Tabata, Shiojiri (JP); Hiroyuki Yoshino, Suwa (JP); Noritaka Ide, Shiojiri (JP); Atsushi Oshima, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 603 days.

This patent is subject to a terminal disclaimer.

(21) Appl. No.: 14/071,461

(22) Filed: Nov. 4, 2013

(65) Prior Publication Data

US 2014/0062257 A1   Mar. 6, 2014

Related U.S. Application Data

(63) Continuation of application No. 13/295,932, filed on Nov. 14, 2011, now Pat. No. 8,604,666.

(30) Foreign Application Priority Data

Nov. 15, 2010 (JP) ................................ 2010-254580

(51) Int. Cl.
*H02N 2/18* (2006.01)

(52) U.S. Cl.
CPC .................... *H02N 2/181* (2013.01)

(58) Field of Classification Search
CPC ....................................................... H02N 2/181
(Continued)

(56) References Cited

U.S. PATENT DOCUMENTS 5,552,656 A   9/1996   Taylor
5,801,475 A   9/1998   Kimura
(Continued)

FOREIGN PATENT DOCUMENTS

CN        1848589 A      10/2006
JP        07-107752 A    4/1995
(Continued)

OTHER PUBLICATIONS

E. Lefeuvre et al., "A comparison between several vibration-powered piezoelectric generators for standalone systems", Sensors and Actuators A: Physical, vol. 126, Issue 2, Feb. 14, 2006, pp. 405-416.

*Primary Examiner* — J. San Martin
(74) *Attorney, Agent, or Firm* — Maschoff Brennan

(57) ABSTRACT

A power generating device includes: a piezoelectric member that is formed from a piezoelectric material; one pair of electrodes that are installed to the piezoelectric member; a transformation unit that repeatedly transforms the piezoelectric member; an inductor that is installed between the one pair of electrodes and configures a resonance circuit together with a capacitive component of the piezoelectric member; a switch that is connected to the inductor in series; and a switch control unit that connects the switch when a transformation direction of the piezoelectric member is switched, and cuts off the switch when a time corresponding to a half period of a resonance period of the resonance circuit elapses.

14 Claims, 6 Drawing Sheets

(58) Field of Classification Search
USPC .................................................. 310/319, 339
See application file for complete search history.

(56) References Cited

U.S. PATENT DOCUMENTS

| | | |
|---|---|---|
| 6,252,336 B1 | 6/2001 | Hall |
| 6,522,048 B1 | 2/2003 | Burns et al. |
| 7,952,248 B2 | 5/2011 | Ono |
| 8,026,650 B2 | 9/2011 | Ramadass et al. |
| 8,368,290 B2 | 2/2013 | Kwon et al. |
| 8,373,332 B2 * | 2/2013 | Lee ..................... H01L 41/1136 310/318 |
| 8,604,666 B2 * | 12/2013 | Tabata ................... H02N 2/181 310/319 |
| 2003/0034715 A1 | 2/2003 | Burns et al. |
| 2010/0102782 A1 | 4/2010 | Thiesen et al. |
| 2012/0119618 A1 | 5/2012 | Tabata et al. |
| 2012/0126666 A1 | 5/2012 | Tabata et al. |
| 2012/0212101 A1 * | 8/2012 | Tabata ................ H01L 41/1136 310/319 |

FOREIGN PATENT DOCUMENTS

| | | |
|---|---|---|
| JP | 11-341837 A | 12/1999 |
| JP | 2003-502000 A | 1/2003 |
| JP | 2005-500790 A | 1/2005 |
| JP | 2005-312269 A | 4/2005 |
| JP | 2010-252509 A | 4/2010 |
| JP | 2010-136542 A | 6/2010 |
| JP | 2011-004598 A | 1/2011 |
| WO | 00/74224 A1 | 12/2000 |

\* cited by examiner

DIRECTION OF TRANSFORMATION

MAXIMUM DOWNWARD DISPLACEMENT

MAXIMUM DOWNWARD DISPLACEMENT

MAXIMUM DOWNWARD DISPLACEMENT

MAXIMUM DOWNWARD DISPLACEMENT

MAXIMUM DOWNWARD DISPLACEMENT

POWER GENERATING DEVICE AND ELECTRONIC COMPONENT

This application is a continuation of U.S. patent application Ser. No. 13/295,932, filed Nov. 14, 2011, which claims priority to Japanese Patent Application No. 2010-254580, filed Nov. 15, 2010. The foregoing applications are incorporated herein by reference.

BACKGROUND

1. Technical Field

The present invention relates to a power generating device that derives electric energy from an electric charge when a piezoelectric material such as a piezoelectric device is transformed by an external force.

2. Related Art

When a piezoelectric material such as lead zirconate titanate (PZI), crystal ($SiO_2$), or zinc oxide (ZnO) is transformed by an external force, electric polarization is caused inside the material, and positive and negative electric charge appears on the surface. Such a phenomenon is called a piezoelectric effect. A method of generating power is proposed in which, by using such a property of the piezoelectric material, a cantilever is vibrated so as to repeatedly weight the piezoelectric material, and an electric charge generated on the surface of the piezoelectric material is derived as electricity.

For example, by vibrating a metal cantilever which has a spindle arranged at its tip end and to which a thin plate of a piezoelectric material is attached, positive and negative electric charge alternately generated in the piezoelectric material in accordance with the vibration is taken out, thereby generating an AC current. A technique is proposed in which such an AC current is rectified by a diode, then stored in a capacitor, and taken out as electric power (JP-A-7-107752). In addition, a technique is proposed in which a DC current is acquired without incurring a voltage loss in a diode by closing the contact point only while positive charge is generated in the piezoelectric device (JP-A-2005-312269). By using such techniques, the power generating device can be miniaturized. Accordingly, for example, there are hopes for an application in which the power generating device is built into a small-sized electronic component instead of a battery cell, or the like.

However, according to the proposed general techniques, there is a problem that the acquired voltage is limited to the level of a voltage that is generated in accordance with electric polarization of the piezoelectric material. Accordingly, in most cases, a separate booster circuit is necessary, and there is a problem that it is difficult to decrease the size of the power generating device.

SUMMARY

An advantage of some aspects of the invention is that it provides a technique for generating a high voltage without increasing the size of a power generating device using the piezoelectric effect of a piezoelectric material.

An aspect of the invention is directed to a power generating device that derives a current from an electric charge generated by a piezoelectric member by transforming the piezoelectric member formed from a piezoelectric material by using an external force. The power generating device includes: a transformation unit that repeatedly transforms the piezoelectric member; one pair of electrodes that are installed to the piezoelectric member; an inductor that is installed between the one pair of electrodes and configures a resonance circuit together with a capacitive component of the piezoelectric member; a switch that is connected to the inductor in series; and a switch control unit that connects the switch when a transformation direction of the piezoelectric member is switched, and cuts off the switch when a time corresponding to a half period of a resonance period of the resonance circuit elapses.

In the above-described power generating device, since the piezoelectric member is repeatedly transformed. As a result, in the piezoelectric member, positive and negative electric charge is generated based on the piezoelectric effect. In addition, the amount of generation of the electric charge increases as the amount of transformation of the piezoelectric member increases. When the magnitude of the amount of transformation is the maximum (in other words, when the transformation direction is switched), the piezoelectric member is connected to the inductor. Since the piezoelectric member can be regarded as a capacitor in the sense of an electric circuit, by connecting the piezoelectric member to the inductor, a resonance circuit is formed. Then, the electric charges generated in the piezoelectric member flow into the inductor. Since the piezoelectric member and the inductor configures a resonance circuit, the current flowing into the inductor overshoots and flows into the piezoelectric member from the opposite terminal. This period (that is, a period until the electric charge started to flow from one terminal of the piezoelectric member flows into the piezoelectric material again from the other terminal disposed on the opposite side through the inductor) is a half of the resonance period of the resonance circuit that is formed by the piezoelectric member and the inductor. Accordingly, when the piezoelectric member and the inductor are connected at the timing at which the transformation direction of the piezoelectric member is switched, and thereafter, the inductor is cut off from the piezoelectric member at the timing at which a time corresponding to a half of the resonance period elapses, the arrangement of positive and negative charge generated inside the piezoelectric member before the connection between the piezoelectric member and the inductor can be reversed. From the state, this time, when the piezoelectric member is transformed in the opposite direction, the electric charge generated based on the piezoelectric effect can be accumulated inside the piezoelectric member. As a result, the electric charge generated by repeatedly transforming the piezoelectric member can be effectively accumulated inside the piezoelectric member. In addition, as the electric charge is accumulated inside the piezoelectric member, the voltage between the terminals increases. Accordingly, a voltage that is higher than a voltage generated due to electric polarization of the piezoelectric material can be generated without separately arranging a booster circuit. Therefore, a small-size power generating device having excellent efficiency can be acquired.

In the above-described power generating device, a rectifier circuit that rectifies an AC current generated by the piezoelectric member may be connected to the one pair of electrodes disposed in the piezoelectric member.

Since the piezoelectric member is repeatedly transformed, an AC current is generated from one pair of electrodes disposed in the piezoelectric member. Accordingly, by connecting the rectifier circuit to one pair of electrodes, the AC current can be converted into a DC current so as to drive various electric loads.

In the above-described power generating device, it may be configured such that the presence of a current flowing through the rectifier circuit from the piezoelectric member is detected, and the switch is connected when no current flows.

When the transformation direction of the piezoelectric member is switched, there is no current flowing through the rectifier circuit from the piezoelectric member. Accordingly, by connecting the switch so as to connect the piezoelectric member and the inductor to each other when no current flows to the rectifier circuit from the piezoelectric member, the switch can be connected at appropriate timing with high accuracy. As a result, since the piezoelectric member and the inductor can be connected when the electric charge generated by the piezoelectric member becomes the maximum, the electric charge generated in the piezoelectric material can be efficiently taken out, whereby power can be efficiently generated.

In a case where the presence of the current flowing through the rectifier circuit from the piezoelectric member is detected, the detection may be performed by using a photocoupler.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
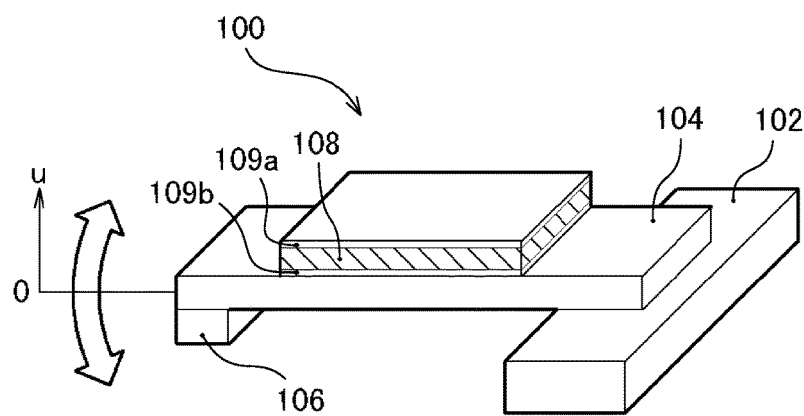
FIGS. 1A and 1B are explanatory diagrams showing the structure of a power generating device according to this embodiment.
Figure 1B:
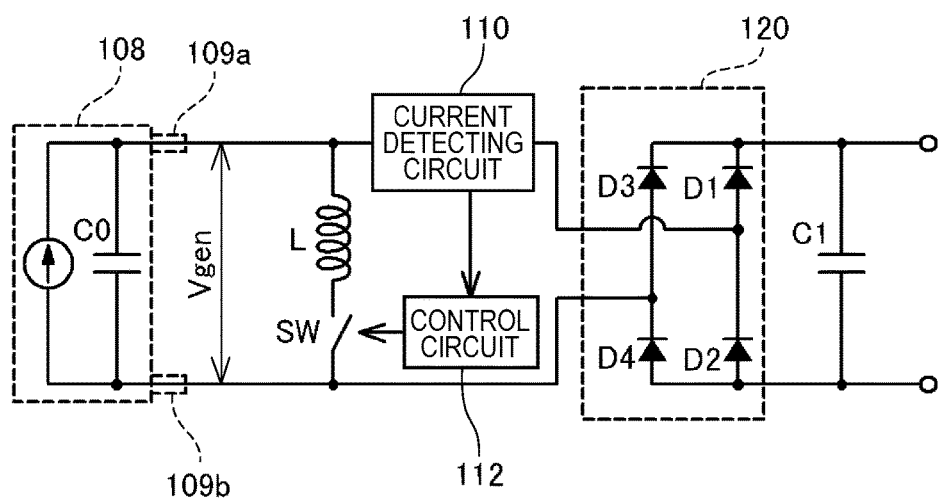

Hereinafter, in order to clarify the content of the invention, embodiments will be described in the following order.
A. Structure of Power Generating Device
B. Operation of Power Generating Device
C. Operating Principle of Power Generating Device
D. Switch Switching Timing
E. Modified Examples A. Structure of Power Generating Device FIGS. 1A and 1B are explanatory diagrams illustrating the structure of a power generating device 100 according to this embodiment. FIG. 1A shows the mechanical structure of the power generating device 100, and FIG. 1B shows the electrical configuration thereof. As the mechanical structure of the power generating device 100 according to this embodiment, a structure is formed in which a crossbeam 104 having a spindle 106 disposed at the tip end is fixed to a support end 102 on the base end side. On the surface of the crossbeam 104, a piezoelectric member 108 that is formed from a piezoelectric material such as lead zirconate titanium (PZT) is disposed. In addition, on the surface of the piezoelectric member 108, on the front and rear sides, an upper electrode 109a and a lower electrode 109b that are formed by a metal foil are disposed, respectively. In the example shown in FIG. 1A, although the piezoelectric member 108 is disposed on the upper face side of the crossbeam 104, the piezoelectric member 108 may be disposed on the lower face side of the crossbeam 104, or the piezoelectric member 108 may be disposed on both the upper face side and the lower face side of the crossbeam 104. In addition, since the piezoelectric member 108 is transformed in accordance with the transformation of the crossbeam 104, the crossbeam 104 corresponds to a "transformation unit" according to an embodiment of the invention.

In the crossbeam 104, the base end side is fixed to the support end 102, and the spindle 106 is disposed on the tip end side. Accordingly, by adding vibration thereto or the like, the tip end of the crossbeam 104 greatly vibrates as denoted by a white arrow in the figure. As a result, a compressive force and a tensile force are alternately applied to the piezoelectric member 108 attached to the surface of the crossbeam 104. Then, the piezoelectric member 108 generates positive and negative electric charge based on the piezoelectric effect, and the electric charge appears in the upper electrode 109a and the lower electrode 109b.

FIG. 1B shows the circuit diagram of the power generating device 100 according to this embodiment. The piezoelectric member 108 can be electrically represented as a current source and a capacitor C0 that stores electric charge. An inductor L is connected to the piezoelectric member 108 in parallel and forms an electric resonance circuit together with a capacitive component of the piezoelectric member 108. A switch SW used for turning On/Off the resonance circuit is connected to the inductor L in series. The turning On/Off of the switch SW is controlled by a control circuit 112. In addition, the upper electrode 109a and the lower electrode 109b disposed in the piezoelectric member 108 are connected to a full-wave rectifier circuit 120 that is configured by four diodes D1 to D4 through a current detecting circuit 110 to be described later. A capacitor (an output capacitor C1) that stores a current after rectification is connected to the full-wave rectifier circuit 120.

B. Operation of Power Generating Device

Figure 2A:
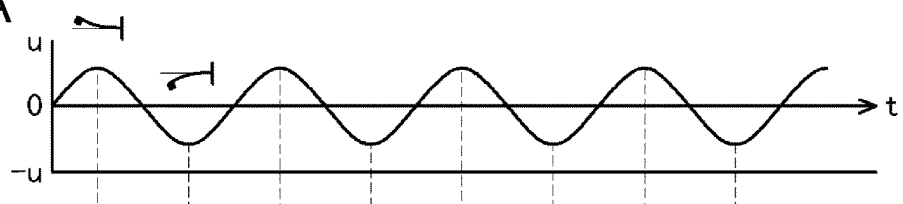
FIGS. 2A to 2D are explanatory diagrams showing the operation of the power generating device according to this embodiment.
Figure 2B:
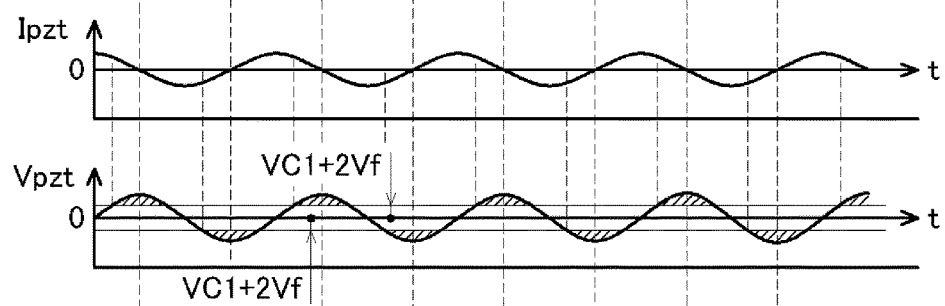

FIGS. 2A to 2D are explanatory diagrams illustrating the operation of the power generating device 100 according to this embodiment. FIG. 2A illustrates the appearance of change in the displacement u of the tip end of the crossbeam 104 in accordance with the vibration of the crossbeam 104. A positive displacement u represents a state in which the crossbeam 104 is in an upwardly warped shape (a state in which the top face side of the crossbeam 104 is indented), and a negative displacement (−u) represents that the crossbeam 104 is in a downwardly warped state (a state in which the bottom face of the crossbeam 104 is indented). FIG. 2B illustrates the appearance of a current generated by the piezoelectric member 108 in accordance with the transformation of the crossbeam 104 and a resultant electromotive force generated inside the piezoelectric member 108. In FIG.

2B, the appearance of the generation of electric charge in the piezoelectric member 108 is represented as the amount of electric charge generated per unit time (that is, a current Ipzt), and the electromotive force generated in the piezoelectric member 108 is represented by an electric potential difference Vpzt generated between the upper electrode 109a and the lower electrode 109b.

As shown in FIGS. 2A and 2B, while the displacement of the crossbeam 104 increases, the piezoelectric member 108 generates a current (in other words, a positive value of the current Ipzt) in the positive direction, and the electric potential difference Vpzt between the upper electrode 109a and the lower electrode 109b increases in the positive direction accordingly. When the electric potential difference Vpzt in the positive direction is larger than the sum of the voltage VC1 of the output capacitor C1 and twice the forward drop voltage Vf of the diode configuring the full-wave rectifier circuit 120, that is, VC1+2Vf, electric charge generated thereafter can be derived as a DC current and stored in the output capacitor C1. On the other hand, while the displacement of the crossbeam 104 decreases, the piezoelectric member 108 generates a current (in other words, a negative value of the current Ipzt) in the negative direction, and the electric potential difference Vpzt between the upper electrode 109a and the lower electrode 109b increases in the negative direction accordingly. When the electric potential difference Vpzt in the negative direction is larger than the sum of the voltage VC1 and twice the forward drop voltage 2Vf of the full-wave rectifier circuit 120, generated electric charge can be derived as a DC current and stored in the output capacitor C1. In other words, even in a state in which the switch SW shown in FIGS. 1A and 1B is turned off, for a portion denoted by applying diagonal lines thereto in FIG. 2B, electric charge can be stored in the output capacitor C1.

Figure 2C:
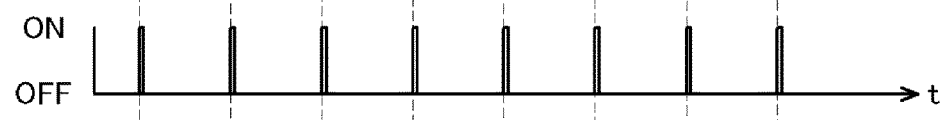
Figure 2D:
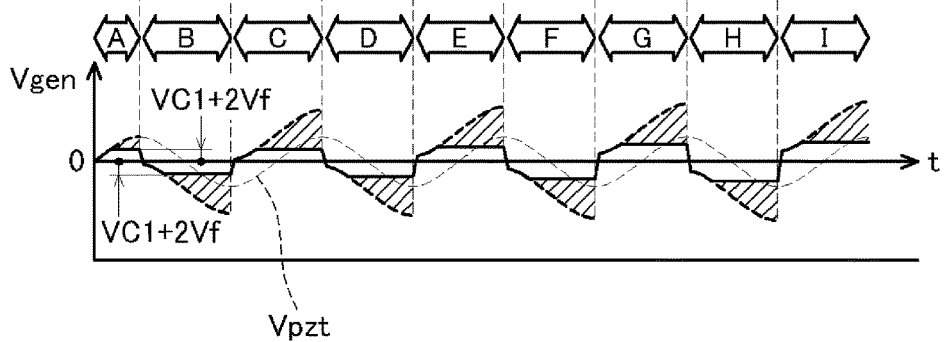

In the power generating device 100 according to this embodiment, the switch SW is turned on at the timing as shown in FIG. 2C. Then, as shown in FIG. 2D, a phenomenon occurs in which the voltage waveform between the terminals of piezoelectric member 108 is shifted at the moment the switch SW is turned on. In other words, for example, in a period B denoted by "B" in FIG. 2D, a voltage waveform denoted by a thick broken line that is acquired by shifting a voltage waveform Vpzt, which is denoted by a thin broken line, corresponding to the electromotive force of the piezoelectric member 108 in the negative direction appears between the terminals of the piezoelectric member 108. The reason for the occurrence of such a phenomenon will be described later. In addition, in a period C denoted by "C" in the FIG. 2D, a voltage waveform, which is denoted by a thick broken line, acquired by shifting the voltage waveform Vpzt corresponding to the electromotive force of the piezoelectric member 108 in the positive direction appears. In the following periods D, E, and F, and the like, similarly, a voltage waveform denoted by a thick broken line that is acquired by shifting the voltage waveform Vpzt corresponding to the electromotive force of the piezoelectric member 108 in the positive direction or the negative direction appears. For a portion in which the shifted voltage waveform exceeds the sum of VC1 and 2Vf (a portion denoted by applying diagonal lines thereto in FIG. 2D), the electric charge generated by the piezoelectric member 108 can be stored in the output capacitor C1. As the electric charge flows from the piezoelectric member 108 to the output capacitor C1, consequently, the voltage between the terminals of the piezoelectric member 108 is clipped to the voltage of the sum of VC1 and 2Vf. As a result, the voltage waveform between the upper electrode 109a and the lower electrode 109b is a waveform denoted by a thick solid line in FIG. 2D.

As is apparent by comparing a case shown in FIG. 2B where the switch SW is maintained to be turned off and a case shown in FIG. 2D where the switch SW is turned on at the timing the transformation direction of the crossbeam 104 is switched, according to the power generating device 100 of this embodiment, by turning the switch SW on at appropriate timing, electric charge can be efficiently stored in the output capacitor C1.

In the output capacitor C1, electric charge can be stored, and as the inter-terminal voltage of the output capacitor C1 increases, the amount of shift of the voltage waveform increases in accordance therewith. For example, when period B (a state in which electric charge is not stored in the output capacitor C1) shown in FIG. 2D and period H (a state in which a small amount of electric charge is stored in the output capacitor C1) shown in FIG. 2D are compared with each other, the amount of shift of the voltage waveform in period H is larger than that in period B. Similarly, when period C and period I shown in FIG. 2D are compared with each other, the amount of shift of the voltage waveform in period I in which the amount of electric charge stored in the output capacitor C1 increases is larger than that in period C. The reason for the occurrence of such a phenomenon will be described later. As a result, according to the power generating device 100 of this embodiment, by transforming the piezoelectric member 108, a voltage that is equal to or higher than the voltage Vpzt generated between the upper electrode 109a and the lower electrode 109b can be stored in the output capacitor C1. Consequently, a special booster circuit does not need to be arranged, and accordingly, a high-efficiency small-size power generating device can be acquired.

C. Operating Principle of Power Generating Device

Figure 3A:
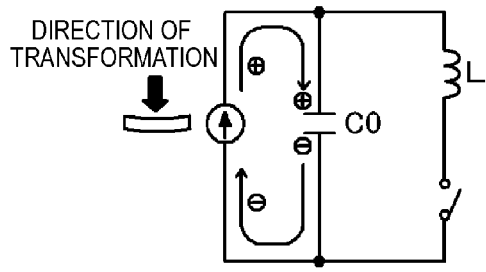
FIGS. 3A to 3F are explanatory diagrams conceptually illustrating a first half part of the operating principle of the power generating device according to this embodiment.
Figure 3A:

FIGS. 3A to 3F are explanatory diagrams conceptually illustrating a first half part of the principle of the operation of the power generating device 100 according to this embodiment. FIGS. 4A to 4F are explanatory diagrams conceptually illustrating a second half part of the principle of the operation of the power generating device 100 according to this embodiment. In FIGS. 3A to 3F, the movement of electric charge inside C0 at the time when the switch SW is turned on in accordance with the transformation of the piezoelectric member 108 is conceptually illustrated. FIG. 3A shows a state in which the piezoelectric member 108 (more precisely, the crossbeam 104) is upwardly transformed (the upper face side is indented). When the piezoelectric member 108 is upwardly transformed, a current flows in the positive direction from a current source, and accordingly, electric charge is stored in C0, thereby generating a voltage Vgen in the positive direction. The voltage value increases as the transformation of the piezoelectric member 108 increases. Then, the switch SW is turned on at the timing transformation of the piezoelectric member 108 is the maximum (timing the amount of electric charge is the maximum (see FIG. 3B)).

Figure 3B:
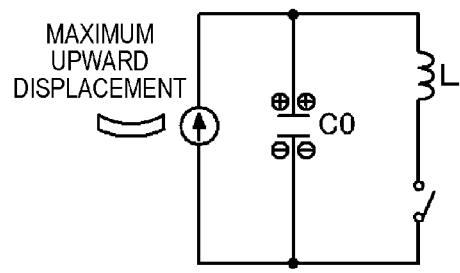
Figure 3B:
Figure 3C:
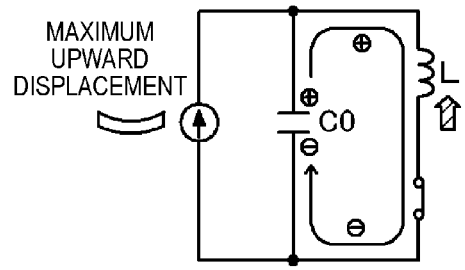
Figure 3C:

FIG. 3C shows a state immediately after the switch SW is turned on. In C0, electric charge is stored, and accordingly, the electric charge tends to flow through the inductor L. When a current flows through the inductor L, a magnetic flux is generated (a magnetic flux increases), and the inductor L has a property (self-induction action) of generating a counter electromotive force in a direction hindering a change in the magnetic flux passing through it. At the moment the switch SW is turned on, the magnetic flux tends to increase due to flow of electric charge, and a counter electromotive force is generated in a direction (in other words, a direction hindering the flow of electric charge) hindering an increase in the magnetic flux. The magnitude of the counter electromotive force is in proportion to the speed of change in the magnetic flux (the amount of change per unit time). In FIG. 3C, the counter electromotive force generated in the inductor L as above is represented by a hatched arrow. Since such an electromotive force is generated, even when the switch SW is turned on, only little electric charge of the piezoelectric member 108 starts to flow. In other words, the current flowing through the inductor L increases little.

Figure 3D:
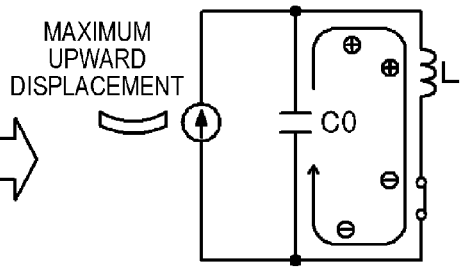
Figure 3E:
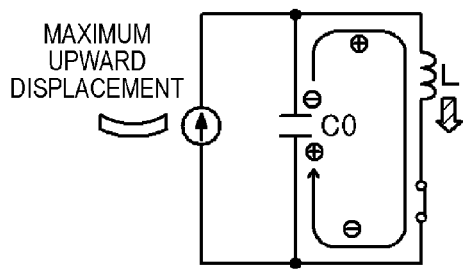
Figure 3E:
Figure 3F:
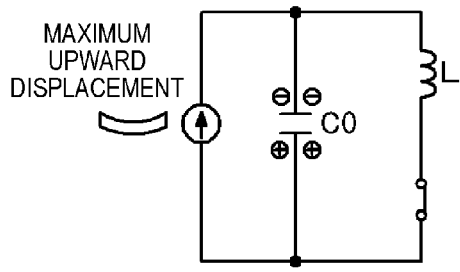
Figure 3F:

Thereafter, when the current flowing through the inductor L reaches its peak, the speed of change in the magnetic flux becomes "0", and as shown in FIG. 3D, the counter electromotive force becomes "0". Then, in turn, the current starts to decrease. Then, since the magnetic flux passing through the inductor L decreases, an electromotive force is generated in the inductor L in a direction (a direction allowing the current to flow) hindering the decrease in the magnetic flux (see FIG. 3E). As a result, while electric charge is drawn out from C0, a current continuously flows through the inductor L. In a case where there is no loss in the middle of the movement of electric charge, all the electric charge generated in accordance with the transformation of the piezoelectric member 108 moves, and a state (in other words, a state is formed in which positive electric charge is distributed on the lower face side of the piezoelectric member 108 and negative electric charge is distributed on the upper face side thereof) is formed in which the positive charge and the negative charge are displaced. FIG. 3F shows a state in which all the positive and negative charge generated in accordance with the transformation of the piezoelectric member 108 moves.

In this state, when the switch SW is maintained as turned on, this time, a phenomenon opposite to the description presented above occurs. In other words, positive charge disposed on the lower face side of the piezoelectric member 108 tends to flow through the inductor L, and at this time, a counter electromotive force is generated in the inductor L in a direction hindering the flow of the electric charge. Thereafter, after the current flowing through the inductor L reaches its peak and then decreases, at this time, an electromotive force in a direction (a direction allowing the current to continuously flow) hindering the decrease in the current is generated in the inductor L. As a result, a state is formed in which all the positive charge disposed on the lower face side of the piezoelectric member 108 moves to the upper face side (the state shown in FIG. 3B). The positive charge which has been returned to the upper face side of the piezoelectric member 108 moves to the lower face side again as described with reference to FIGS. 3B to 3F.

As above, when the switch SW is turned on in a state in which electric charge is stored in C0, and the state is maintained, a type of resonance phenomenon occurs in which the direction of the current alternately inverts between the piezoelectric member 108 and the inductor L. The period of this resonance phenomenon is the period T of a so-called LC resonance circuit, and thus, when the magnitude (capacitance) of the capacitive component C0 included in the piezoelectric member 108 is C, and the magnitude (inductance) of the inductive element of the inductor L is L, the period T is given as $T=2\pi(LC)^{0.5}$. Accordingly, a time from immediately after the switch SW is turned on (the state as shown in FIG. 3B) to a time the state as shown in FIG. 3F is formed is T/2.

Figure 4A:
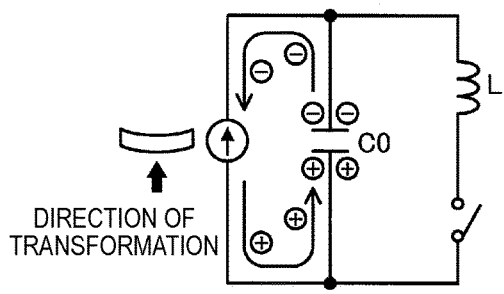
FIGS. 4A to 4F are explanatory diagrams conceptually illustrating a second half part of the operating principle of the power generating device according to this embodiment.
Figure 4F:
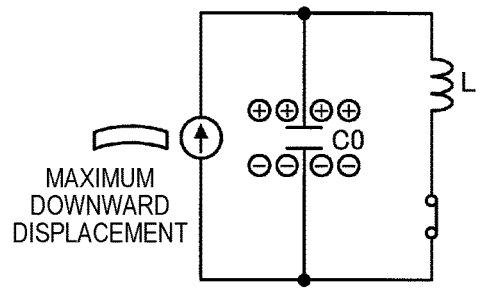
Figure 4F:
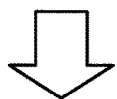
Figure 4F:
Figure 4B:
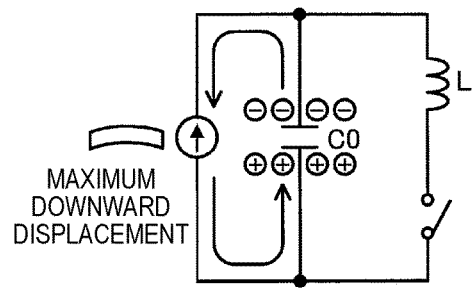
Figure 4E:
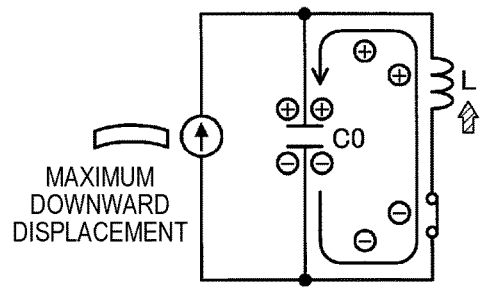
Figure 4E:
Figure 4E:
Figure 4C:
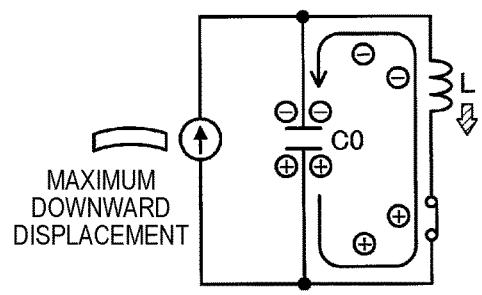
Figure 4C:
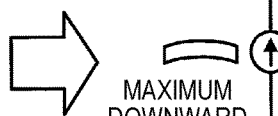
Figure 4D:
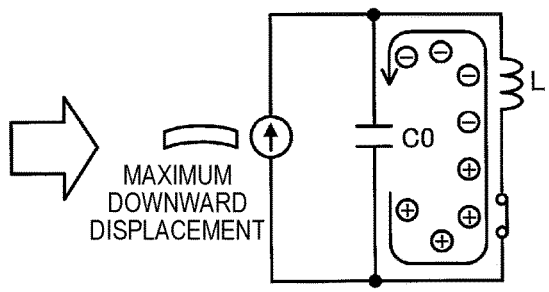

Thus, at a time point when a time T/2 elapses after the switch SW is turned on, as shown in FIG. 4A, the switch SW is turned off. Then, from this state, the piezoelectric member 108 (more precisely the crossbeam 104) is downwardly transformed in turn (the lower side is indented). In FIG. 3A described above, although the piezoelectric member 108 is upwardly transformed, in FIG. 4A, the piezoelectric member is downwardly transformed. Accordingly, a current in the negative direction flows from the current source, and electric charge is accumulated in C0 so as to increase Vgen in the negative direction. As described above with reference to FIGS. 3A to 3F, in a stage before the piezoelectric member 108 (more precisely, the crossbeam 104) is downwardly transformed, positive charge is distributed on the lower face side of the piezoelectric member 108, and negative charge is distributed on the upper face side, and accordingly, in addition to the electric charge, new positive charge is accumulated on the lower face side, and new negative charge is accumulated on the upper face side. In FIG. 4B, a state is shown in which new electric charge is accumulated in the piezoelectric member 108 by transforming the piezoelectric member 108 (more precisely, the crossbeam 104) in the state in which the switch SW is turned off.

When the switch SW is turned on from this state, the positive charge accumulated on the lower face side of the piezoelectric member 108 tends to flow through the inductor L. At this time, since a counter electromotive force is generated in the inductor L (see FIG. 4C), the current start to flow a little, then reaches its peak, and decreases thereafter. Then, an electromotive force is generated in a direction hindering the decrease in the current (the direction allowing the current to continuously flow) in the inductor L (see FIG. 4E), the current continuously flows in accordance with the electromotive force, and finally, a state is formed in which all the positive charge distributed on the lower face side of the piezoelectric member 108 moves to the upper face side, and all the negative charge distributed on the upper face side moves to the lower face side (see FIG. 4F). In addition, a time required for moving all the positive charge disposed on the lower face side to the upper face side and moving all the negative charge disposed on the upper face side to the lower face side is a time T/2 corresponding to a half period of the LC resonance circuit. Thus, when the time T/2 elapses after the switch SW is turned on, the switch SW is turned off, and, at this time, in a case where the piezoelectric member 108 (more precisely, the crossbeam 104) is upwardly transformed (the upper face side is indented), the positive and negative electric charge can be accumulated further inside the piezoelectric member 108.

As described above, according to the power generating device 100 of this embodiment, after electric charge is generated by transforming the piezoelectric member 108, the piezoelectric member 108 is connected to the inductor L, and a resonance circuit is formed during a half period of the resonance period, whereby the distribution of the positive and negative electric charge is inverted inside the piezoelectric member 108. Thereafter, the piezoelectric member 108 is transformed in the opposite direction so as to generate new electric charge. Since the distribution of the positive and negative electric charge is inverted inside the piezoelectric member 108, the electric charge that is newly developed is accumulated in the piezoelectric member 108. Thereafter, again, the piezoelectric member 108 is connected to the inductor L only for half the resonance period, the distribution of the positive and negative charge is inverted inside the piezoelectric member 108, and then the piezoelectric member 108 is transformed in the opposite direction. By repeating such an operation, each time the piezoelectric member 108 is repeatedly transformed, the electric charge accumulated in the piezoelectric member 108 can be increased.

As described with reference to FIGS. 2A to 2D, in the power generating device 100 of this embodiment, a special phenomenon occurs in which the voltage waveform between terminals of the piezoelectric member 108 is shifted each time the switch SW is turned on, and such a phenomenon is occurs through the above-described mechanism. In other words, for example, in period A shown in FIG. 2D, although a voltage is generated between the upper electrode 109a and the lower electrode 109b in accordance with the transformation of the piezoelectric member 108 (more precisely, the crossbeam 104), the upper electrode 109a and the lower electrode 109b are connected to the full-wave rectifier circuit 120, and accordingly, the electric charge exceeding a voltage corresponding to the sum of VC1 and 2Vf flow into the output capacitor C1 that is connected to the full-wave rectifier circuit 120. As a result, when the switch SW is turned on at a time point at which the transformation of the crossbeam 104 becomes the maximum, the positive and negative charge remaining inside the piezoelectric member 108 at that time moves through the inductor L, whereby the arrangement of the positive and negative charge inside the piezoelectric member 108 is interchanged. As is apparent from the mechanism described with reference to FIGS. 3A to 4F, the period in which the switch SW is turned on is a time corresponding to a half of the resonance period of the resonance circuit that is configured by the capacitive component of the piezoelectric member 108 and the inductor L.

When the crossbeam 104 is transformed in the opposite direction from the state in which the arrangement of the positive and negative electric charge is interchanged, a voltage waveform appears between the upper electrode 109a and the lower electrode 109b of the piezoelectric member 108 based on the piezoelectric effect. In other words, from the state in which the polarities of the upper electrode 109a and the lower electrode 109b of the piezoelectric member 108 are interchanged, a voltage change occurs due to the transformation of the piezoelectric member 108. As a result, in period B shown in FIG. 2D, a voltage waveform acquired by shifting the voltage waveform generated in the piezoelectric member 108 in accordance with the transformation of the crossbeam 104 appears. Above all, as described above, the electric charge exceeding the voltage corresponding to the sum of VC1 and 2Vf flows into the output capacitor C1, and accordingly, the voltage between the upper electrode 109a and the lower electrode 109b of the piezoelectric member 108 is clipped to the voltage of the sum of VC1 and 2Vf. Thereafter, when the switch SW is turned on for a time corresponding to a half of the resonance period, the arrangement of the positive and negative charge remaining in the piezoelectric member 108 is interchanged. Then, as the crossbeam 104 is transformed from that state, a voltage waveform based on the piezoelectric effect appears in the piezoelectric member 108. Accordingly, also in period C shown in FIG. 2D, a voltage waveform acquired by shifting the voltage waveform generated in accordance with the transformation of the crossbeam 104 appears.

In addition, as described above with reference to FIGS. 2A to 2D, in the power generating device 100 of this embodiment, while the transformation of the crossbeam 104 repeats to be transformed, a phenomenon occurs in which the amount of the shift of the voltage waveform gradually increases. Accordingly, a remarkable advantage that a voltage higher than the electric potential difference generated between the upper electrode 109a and the lower electrode 109b can be stored in the output capacitor C1 based on the piezoelectric effect of the piezoelectric member 108 can be acquired. Such a phenomenon occurs through the following mechanism.

First, as illustrated in period A or B shown in FIG. 2D, in a case where the output capacitor C1 is not charged, when the voltage generated between the terminals of the piezoelectric member 108 exceeds 2Vf of the full-wave rectifier circuit 120, electric charge flows into the output capacitor C1 from the piezoelectric member 108, and the voltage appearing between the terminals of the piezoelectric member 108 is clipped to 2Vf. However, the voltage between the terminals of the output capacitor C1 increases in accordance with the accumulation of electric charge in the output capacitor C1 as above. Thereafter, the electric charge does not flow into from the piezoelectric member 108 until the inter-terminal voltage of the output capacitor C1 becomes a voltage higher than the sum of VC1 and 2Vf. Accordingly, the value at which the inter-terminal voltage of the piezoelectric member 108 is clipped gradually increases in accordance with the accumulation of electric charge in the output capacitor C1.

In addition, as described above with reference with FIGS. 3A to 4F, so long as electric charge is not allowed to flow out of the piezoelectric member 108, each time the piezoelectric member 108 (more precisely, the crossbeam 104) is transformed, the electric charge disposed inside the piezoelectric member 108 increases. Then, the inter-terminal voltage of the piezoelectric member 108 increases in accordance with the increase in the electric charge. Accordingly, the voltage of the inter-terminal voltage of the piezoelectric member 108 can be high in a case where the loss or the like is not considered, which occurs when the electric charge flows though the inductor L or the switch SW. Therefore, according to the power generating device 100 of this embodiment, power can be generated in a state in which the voltage is naturally raised up to a voltage level necessary for driving an electric load without arranging a special booster circuit.

D. Switch Switching Timing

As described above, in the power generating device 100 of the this embodiment, repetitive transformation is applied to the piezoelectric member 108 (more precisely, the crossbeam 104), at the moment at which the transformation direction is switched, the piezoelectric member 108 is connected to the inductor L only for a time corresponding to a half of the resonance period, and accordingly, the efficiency is improved. In addition, since the booster circuit is not necessary, a superior advantage that the size of the device can be decreased in an easy manner can be acquired. Above all, it is not so easy to turn the switch SW on at the moment at which the transformation direction of the crossbeam 104 is switched. For example, the moment at which the transformation direction of the crossbeam 104 is switched is a moment at which the magnitude of the displacement of the crossbeam 104 is the maximum, and accordingly, the switch may be configured so as to be tuned on at the moment at which the crossbeam 104 is at the maximum displacement by using a mechanical contact point. However, in a case where the adjustment of the contact point is mismatched, the efficiency greatly decreases. Thus, in the power generating device 100 of the this embodiment, as shown in FIG. 1B, the switch SW is controlled by detecting a current flowing through the full-wave rectifier circuit 120 from the piezoelectric member 108 by using the current detecting circuit 110.

Figure 5A:
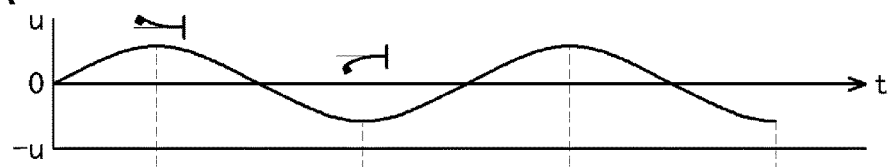
FIGS. 5A to 5E are explanatory diagrams illustrating the reason that a switch can be controlled at appropriate timing by detecting a current flowing from a piezoelectric member to a full-wave rectifier circuit.
Figure 5B:
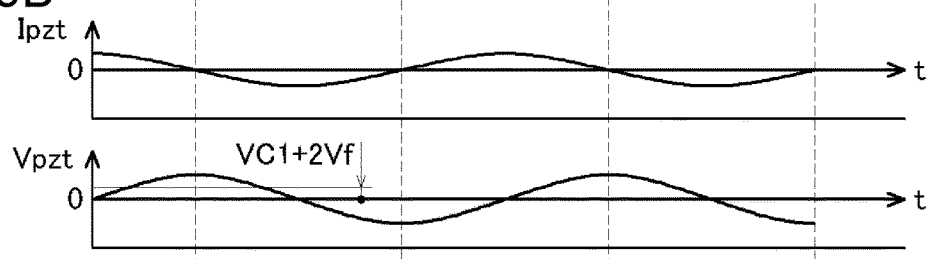

FIGS. 5A to 5E are explanatory diagrams illustrating a reason that the switch SW can be controlled at appropriate timing by detecting the current flowing through the full-wave rectifier circuit 120 from the piezoelectric member 108. FIG. 5A shows the displacement of the crossbeam 104. FIG. 5B shows the appearance of a change in the amount of electric charge (that is, the current Ipzt) generated by the piezoelectric member 108 per unit time in accordance with the vibration of the crossbeam 104 and the appearance of a change in the electromotive force Vpzt generated in accordance with the current Ipzt.

As shown in the figure, as the displacement of the crossbeam 104 increases, the electromotive force Vpzt increases as well. When the electromotive force Vpzt is higher than the sum of the voltage VC1 of the output capacitor C1 and twice the forward drop voltage Vf of the diode configuring the full-wave rectifier circuit 120, that is, VC1+2Vf, the generated electric charge flows through the full-wave rectifier circuit 120.

In addition, at a moment at which the magnitude of the displacement of the crossbeam 104 becomes the maximum (in other words, a moment at which the transformation direction of the crossbeam 104 is switched), the direction of the current Ipzt generated by the piezoelectric member 108 is reversed. For example, in a state in which the piezoelectric member 108 generates a positive electromotive force, when the magnitude of the displacement of the crossbeam 104 becomes the maximum, the current Ipzt flowing in the positive direction is inverted in the negative direction. Accordingly, the electromotive force of the piezoelectric member 108 decreases, and the voltage thereof is lower than the sum of VC1 and 2Vf, whereby the current that has flowed through the full-wave rectifier circuit 120 becomes unable to flow. Similarly, in a state in which a negative electromotive force is generated by the piezoelectric member 108, as the current Ipzt flowing in the positive direction is generated, the current that has flowed through the full-wave rectifier circuit 120 becomes unable to flow. Accordingly, the moment at which the transformation direction of the crossbeam 104 is switched (the moment at which the magnitude of the displacement of the crossbeam 104 is the maximum) coincides with the moment at which a current becomes unable to flow through the full-wave rectifier circuit 120 from the piezoelectric member 108. Therefore, as shown in FIG. 1B, in a case where the current flowing through the full-wave rectifier circuit 120 is detected by using the current detecting circuit 110, when no current is detected, the switch SW may be turned on only for a predetermined time (a half of the resonance period) from that moment.

Figure 5C:
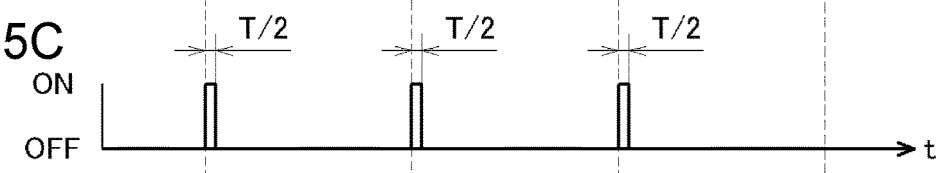
Figure 5D:
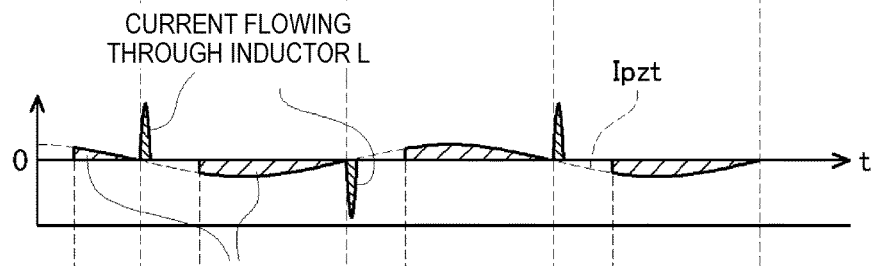

FIG. 5C illustrates the appearance in which the switch SW is turned on for a half of the resonance period by detecting that a current has not flowed through the full-wave rectifier circuit 120. FIG. 5D shows a current flowing through the inductor L and a current (the current flowing through the full-wave rectifier circuit 120) detected by the current detecting circuit 110, as a result of the operation of the switch. Here, between the piezoelectric member 108 and the inductor L, a current acquired by summing the two currents flows.

Figure 5E:
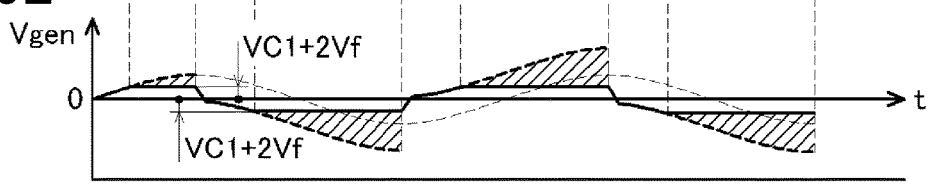

As shown in FIG. 5D, when the switch SW is turned on, electric charge disposed inside the piezoelectric member 108 flows through the inductor L, and the arrangement of positive and negative charge inside the piezoelectric member 108 is switched. Then, as the piezoelectric member 108 is transformed in the state in which the arrangement of the electric charge is switched, between the terminals of the piezoelectric member 108, a voltage waveform as shown in FIG. 5E is generated. Since this voltage waveform is the same as the voltage waveform described with reference to FIG. 2D, the description thereof will be omitted here. As a result, as shown in FIG. 5D, the current Ipzt generated by the piezoelectric member 108 can be efficiently stored in the output capacitor C1.

Finally, in this embodiment, the configurations of the current detecting circuit 110 and the control circuit 112 will be briefly described. Inside the current detecting circuit 110, a general current detecting sensor such as a hall element is mounted. The output of the current detecting sensor is amplified and is converted into an absolute value. Then, by comparing the acquired absolute value with a predetermined threshold value (a positive value slightly greater than zero), a moment at which the absolute value is smaller than the threshold value may be detected. In addition, the switch SW may be controlled by generating a pulse having a time width corresponding to a half of the resonance period with the detected moment used as a trigger and inputting the pulse to the control circuit 112. In order to generate a pulse having a time width corresponding to the half of the resonance period, a delay circuit may be used, or a time corresponding to the half of the resonance period may be measured by using a timer. In this embodiment, the current detecting circuit 110 and the full-wave rectifier circuit 120 correspond to a "switch control unit" according to an embodiment of the invention.

E. Modified Example

In the description presented above, the current detecting sensor such as a hall element is mounted inside the current detecting circuit 110, and, by processing the output thereof, the timing at which no current has flowed is detected. However, some of the diodes D1 to D4 that configure the full-wave rectifier circuit 120 may be replaced by a photocoupler. In such a case, the presence of the current is directly detected by the photocoupler.

Figure 6:
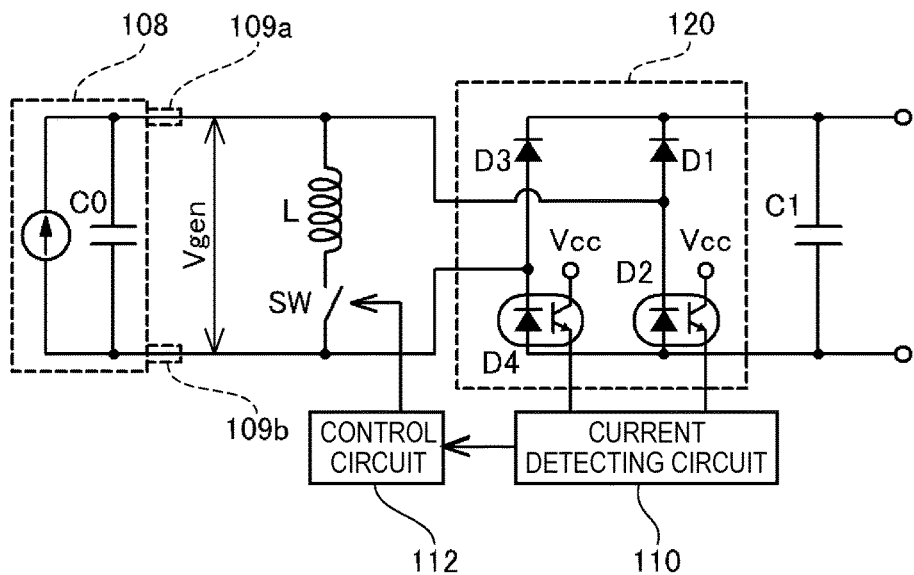
FIG. 6 is an explanatory diagram illustrating the circuit configuration of a power generating device according to a modified example in which a photocoupler is built in a part of the full-wave rectifier circuit.

FIG. 6 is an explanatory diagram illustrating the circuit configuration of a power generating device 100 according to a modified example in which some of the diodes D1 to D4 configuring the full-wave rectifier circuit 120 are replaced by photocouplers. In the example shown in the figure, although the diodes D2 and D4 are replaced by the photocouplers, the invention is not limited thereto. Thus, the diodes D1 and D3 may be replaced by photocouplers, the diodes D1 and D4 may be replaced by photocouplers, or the diodes D2 and D3 may be replaced by photocouplers. In such a case, while a current flows through the full-wave rectifier circuit 120, one of the photocouplers can detect that. Accordingly, the current detecting circuit 110 can instantly detect that no current has flowed through the full-wave rectifier circuit 120. As a result, as described above, without installing a current detecting sensor such as a hall element or performing a complicated process such as amplifying of the output of a sensor and acquiring of the absolute value thereof or comparing of the acquired absolute value with a threshold value, the switch SW can be turned on at appropriate timing.

Figure 7:
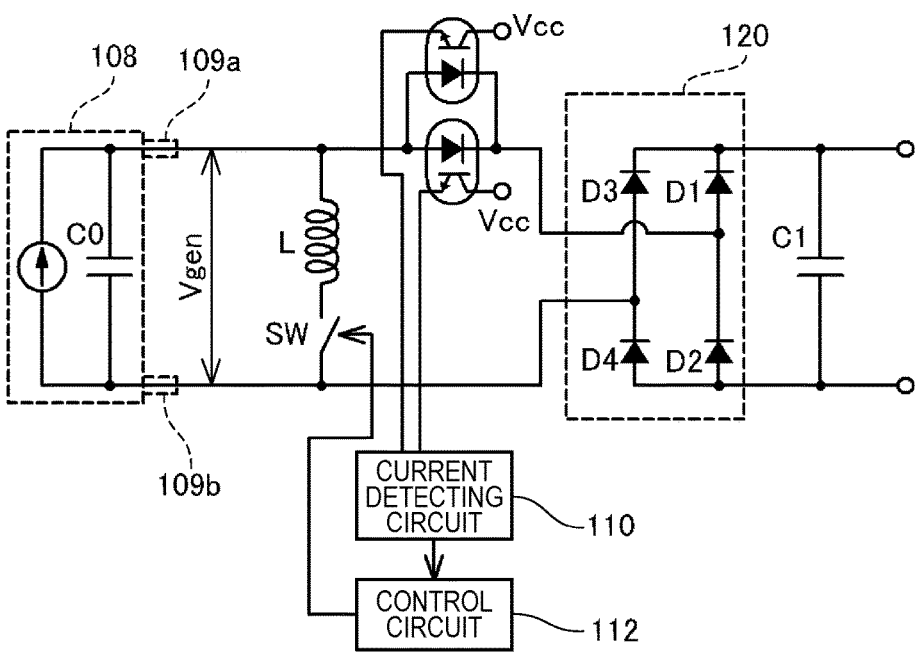
FIG. 7 is an explanatory diagram showing another form of the modified example in which a photocoupler is built between the piezoelectric member and the full-wave rectifier circuit.

Alternatively, as shown in FIG. 7, it may be configured such that photocouplers are inserted between the upper electrode 109a and the lower electrode 109b and the full-wave rectifier circuit 120, and the presence of the current flowing through the full-wave rectifier circuit 120 is detected.

As above, although this embodiment and modified examples have been described, the invention is not limited thereto and can be performed in various forms within the scope not departing from the concept thereof.

For example, in the above-described embodiment, the piezoelectric member 108 has been described to be installed to the crossbeam 104 having a cantilever structure. However, a member to which the piezoelectric member 108 is installed may be any member, as long as it can be repeatedly transformed easily in accordance with vibration or the like. For example, the piezoelectric member 108 may be installed to the surface of a thin film, or the piezoelectric member 108 may be installed to the side face of a helical spring.

What is claimed is:

1. A power generating device comprising:
   a piezoelectric member;
   two electrodes that are installed to the piezoelectric member;
   an inductor that is installed between the electrodes and configures a resonance circuit together with a capacitive component of the piezoelectric member; and
   a switch that is connected to the inductor in series,
   wherein the switch is turned on when a transformation direction of the piezoelectric member is switched and turned off when a time corresponding to a half period of a resonance period of the resonance circuit elapses after the switch is turned on.

2. The power generating device according to claim 1, further comprising a rectifier circuit that is connected to the electrodes and rectifies an AC current generated by the piezoelectric member.

3. The power generating device according to claim 2, wherein the switch is turned on when a current does not flow through the rectifier circuit or between the rectifier circuit and the at least one of the electrodes.

4. The power generating device according to claim 3, further comprising a current detecting unit that detects the current.

5. The power generating device according to claim 4, wherein the current detecting unit is in the rectifier circuit.

6. The power generating device according to claim 4, wherein the inductor is connected to the current detecting unit and the current detecting unit is connected to the rectifier circuit.

7. The power generating device according to claim 5, wherein the current detecting unit has a photocoupler to detects the current.

8. The power generating device according to claim 6, wherein the current detecting unit has a photocoupler to detects the current.

9. A power generating device comprising:
   a piezoelectric member;
   two electrodes that are installed to the piezoelectric member;
   an inductor that is installed between the electrodes and configures a resonance circuit together with a capacitive component of the piezoelectric member;
   a switch that is connected to the inductor in series; and
   a rectifier circuit that is connected to the electrodes and rectifies an AC current generated by the piezoelectric member,
   wherein the switch is turned on when a current does not flow through the rectifier circuit or between the rectifier circuit and at least one of the electrodes and turned off when a time corresponding to a half period of a resonance period of the resonance circuit elapses after the switch is turned on.

10. The power generating device according to claim 9, further comprising a current detecting unit that detects the current.

11. The power generating device according to claim 10, wherein the current detecting unit is in the rectifier circuit.

12. The power generating device according to claim 10, wherein the inductor is connected to the current detecting unit and the current detecting unit is connected to the rectifier circuit.

13. The power generating device according to claim 11, wherein the current detecting unit has a photocoupler to detects the current.

14. The power generating device according to claim 12, wherein the current detecting unit has a photocoupler to detects the current.

* * * * *